(12) United States Patent
Gandikota et al.

(10) Patent No.: US 9,530,627 B2
(45) Date of Patent: Dec. 27, 2016

(54) METHOD FOR CLEANING TITANIUM ALLOY DEPOSITION

(71) Applicant: Applied Materials, Inc., Santa Clara, CA (US)

(72) Inventors: Srinivas Gandikota, Santa Clara, CA (US); Xinliang Lu, Fremont, CA (US); Kyoung-Ho Bu, Pleasanton, CA (US); Jing Zhou, Milpitas, CA (US); Seshadri Ganguli, Sunnyvale, CA (US); David Thompson, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 134 days.

(21) Appl. No.: 14/484,423

(22) Filed: Sep. 12, 2014

(65) Prior Publication Data

US 2015/0086722 A1    Mar. 26, 2015

Related U.S. Application Data

(60) Provisional application No. 61/883,175, filed on Sep. 26, 2013.

(51) Int. Cl.
*H01J 37/32* (2006.01)
*C23C 16/44* (2006.01)

(52) U.S. Cl.
CPC ..... *H01J 37/32862* (2013.01); *C23C 16/4405* (2013.01); *H01J 37/32522* (2013.01); *H01J 37/32724* (2013.01)

(58) Field of Classification Search
None
See application file for complete search history.

(56) References Cited

U.S. PATENT DOCUMENTS

| | | | |
|---|---|---|---|
| 6,242,347 B1 * | 6/2001 | Vasudev | H01L 21/67028 438/680 |
| 2002/0094387 A1 * | 7/2002 | Bhan | C23C 16/4404 427/569 |
| 2002/0157611 A1 * | 10/2002 | Bondestam | C23C 16/301 118/725 |
| 2011/0057267 A1 * | 3/2011 | Chuang | H01L 21/82384 257/380 |
| 2012/0231486 A1 * | 9/2012 | Lavold | G01N 30/7266 435/23 |

* cited by examiner

*Primary Examiner* — Michael P Rodriguez
(74) *Attorney, Agent, or Firm* — Patterson & Sheridan, LLP

(57) ABSTRACT

Embodiments described herein relate to a thermal chlorine gas cleaning process. In one embodiment, a method for cleaning N-Metal film deposition in a processing chamber includes positioning a dummy substrate on a substrate support. The processing chamber is heated to at least about 50 degrees Celsius. The method further includes flowing chlorine gas into the processing chamber and evacuating chlorine gas from the processing chamber. In another embodiment, a method for cleaning titanium aluminide film deposition in a processing chamber includes heating the processing chamber to a temperature between about 70 about degrees Celsius and about 100 degrees Celsius, wherein the processing chamber and the substrate support include one or more fluid channels configured to heat or cool the processing chamber and the substrate support.

20 Claims, 2 Drawing Sheets

METHOD FOR CLEANING TITANIUM ALLOY DEPOSITION

CROSS-REFERENCE TO RELATED APPLICATIONS

This application claims benefit of U.S. Provisional Patent Application Ser. No. 61/883,175, filed Sep. 26, 2013 which is incorporated by reference in its entirety.

BACKGROUND

Field

Embodiments of the present disclosure generally relate to a method of cleaning N-Metal film deposition from processing chamber components, and more particularly to a method of cleaning titanium aluminide film deposition from processing chamber components.

Description of the Related Art

Semiconductor process chamber components often have films deposited thereon as a result of processes performed in the chambers. The films deposited on the components may eventually peel or flake off and possibly shed particles onto a substrate being processed. The particles may cause defects in the integrated circuits being formed on the substrate.

Processing chamber components have been roughened to enhance the retention of deposited films, thereby extending the time at which the chamber component must be cleaned to preventing the films from flaking off the chamber component and becoming sources of contamination. Common examples of roughening processes include grit blasting and applying a twin wire arc spray coating. However, as surfaces have been roughened to greater and greater surface roughness ($R_A$) with the intention of retaining films for even longer intervals, coatings on peaks of the roughened surfaces have an increasing propensity to break off, thus becoming a frequent source of contamination themselves and making many highly roughened surfaces unsuitable for critical applications. Therefore, cleaning of the processing chamber components is required to enhance the lifetime of the components and prevent particles from shedding onto the substrate being processed.

Conventional cleaning methods include plasma cleaning of the processing

However, plasma cleaning of the processing chamber often results in "over-cleaning" of the processing chamber components and damages the integrity of the processing chamber components. Thus, there is a need in the art for an improved method for cleaning processing chamber components.

SUMMARY

Methods for cleaning N-Metal film deposits in a processing chamber are provided. In one embodiment, the method includes positioning a dummy substrate on a substrate support in the processing chamber; heating the processing chamber to over at least 50 degrees Celsius flowing chlorine gas into the processing chamber to remove the N-metal film deposits from the processing chamber and evacuating the chlorine gas from the processing chamber.

In another embodiment, a method for cleaning N-Metal film deposits in a processing chamber is provided that include depositing the layer of N-Metal on a substrate disposed on a substrate support positioned in the processing chamber; removing the substrate from the processing chamber; positioning a dummy substrate on the substrate support; and performing a cleaning process while the dummy substrate is disposed in the processing chamber. The cleaning process may include heating the processing chamber to over at least 50 degrees Celsius; and flowing chlorine gas into the processing chamber to remove the N-metal film deposits from the processing chamber.

In another embodiment, a method for cleaning titanium aluminide film deposition in a processing chamber includes positioning a dummy substrate on a substrate support in the processing chamber. The processing chamber is heated to about 70 degrees Celsius, wherein the processing chamber pressure is at about 10 Torr. The method further includes flowing chlorine gas at a rate of 1,000 sccm over the dummy substrate to remove the titanium aluminide film deposition, and evacuating the chlorine gas from the processing chamber.

In yet another embodiment, a method for cleaning titanium aluminide film deposition in a processing chamber includes positioning a dummy substrate on a substrate support in the processing chamber. The processing chamber is heated to a temperature between about 70 degrees Celsius and 100 degrees Celsius, wherein the processing chamber and the substrate support include one or more fluid channels configured to heat or cool the processing chamber and the substrate support. The method further includes flowing chlorine gas over the dummy substrate to remove the titanium aluminide film deposition, and evacuating the chlorine gas from the processing chamber.

BRIEF DESCRIPTION OF THE DRAWINGS

So that the manner in which the above recited features of the present disclosure can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
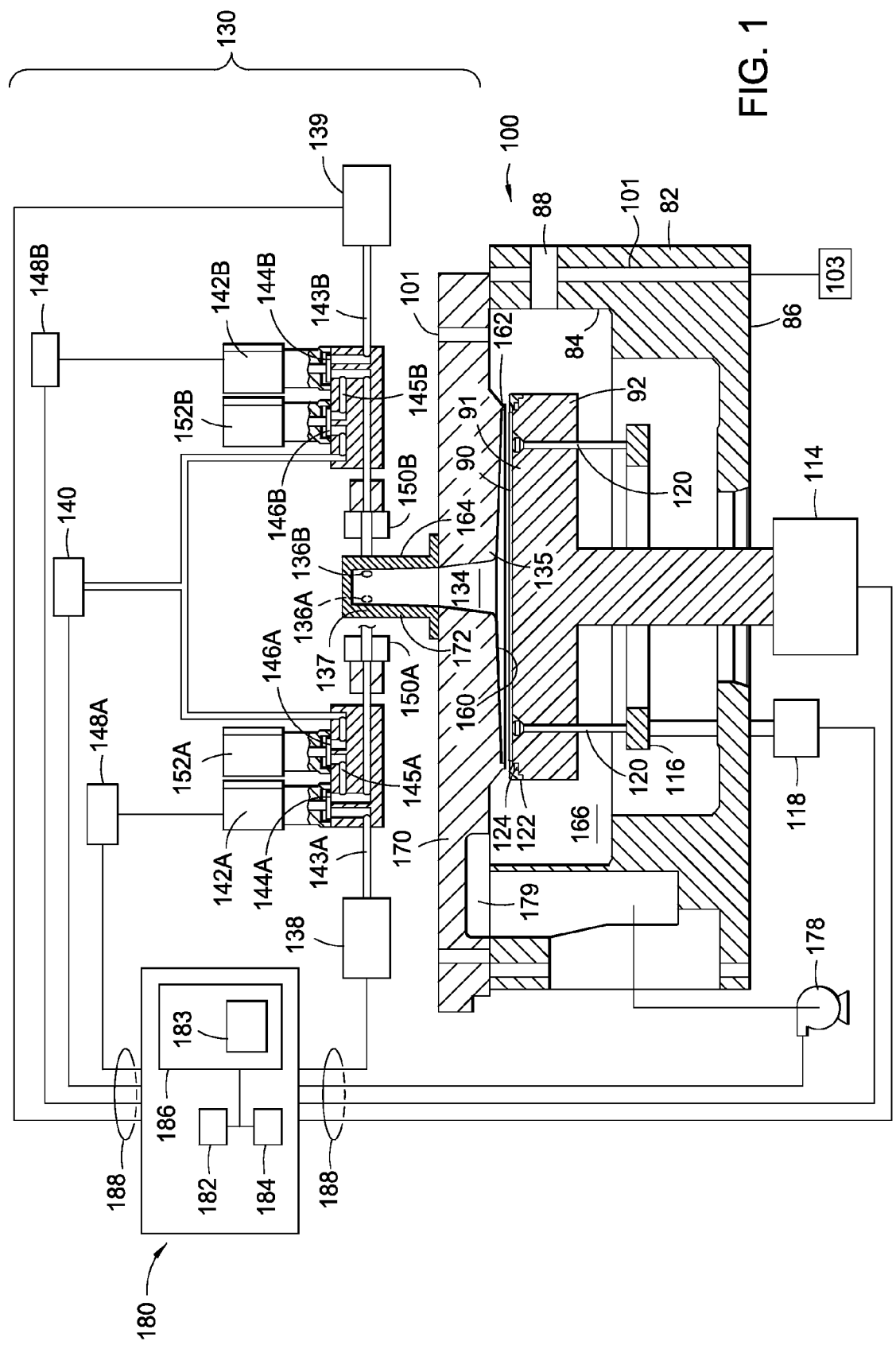
FIG. 1 is a schematic view of a processing chamber according to one embodiment of the invention.

FIG. 1 is a schematic cross-sectional view of one embodiment of a processing chamber 100 suitable for depositing N-Metal films having a work function of less than about 4.3 eV. The processing chamber 100 includes a gas delivery apparatus 130 adapted for cyclic deposition, such as atomic layer deposition (ALD), rapid chemical vapor deposition (CVD), or plasma enhanced atomic layer deposition (PEALD) wherein the terms ALD, CVD, PEALD refer to the sequential introduction of reactants or precursors to deposit a layer over a substrate structure. The sequential introduction of precursors may be repeated to deposit a plurality of thin layers to form a conformal layer to a desired thickness.

The processing chamber 100 comprises a chamber body 82 having sidewalls 84 and a bottom 86. The sidewalls 84 may include fluid channels 101 coupled to a fluid source 103 for heating and cooling the sidewalls 84. The sidewalls 84 may also include a liner to protect the sidewalls 84 from the process gasses. A slit valve 88 in the processing chamber 100 provides access for a robot (not shown) to deliver and retrieve a substrate 90 from the processing chamber 100.

A substrate support 92 supports the substrate 90 on a substrate receiving surface 91 in the processing chamber 100. The substrate support 92 is mounted to a lift motor 114 to raise and lower the substrate support 92 and the substrate 90 disposed thereon. A lift plate 116 connected to a lift motor 118 is mounted in the processing chamber 100 and raises and lowers pins 120 movably disposed through the substrate support 92. The pins 120 raise and lower the substrate 90 over the surface of the substrate support 92. The substrate support 92 may include a vacuum chuck, an electrostatic chuck, or a clamp ring for securing the substrate 90 to the substrate support 92 during processing.

The substrate support 92 may be heated to increase the temperature of a substrate 90 disposed thereon. For example, the substrate support 92 may be heated using an embedded heating element, such as a resistive heater, or may be heated using radiant heat, such as heating lamps disposed above the substrate support 92. A purge ring 122 may be disposed on the substrate support 92 to define a purge channel 124 which provides a purge gas to a peripheral portion of the substrate 90 to prevent deposition thereon.

A gas delivery apparatus 130 is disposed at an upper portion of the chamber body 82 to provide a gas, such as a process gas and/or a purge gas, to the chamber 80. A vacuum system 178 is in communication with a pumping channel 179 to evacuate any desired gases from the processing chamber 100 and to help maintain a desired pressure or a desired pressure range inside a pumping zone 166 of the processing chamber 100.

In one embodiment, the processing chamber 100 allows process gas and/or purge gas to enter the processing chamber 100 normal (i.e., 90 degrees) with respect to the plane of the substrate 90 via the gas delivery apparatus 130. Therefore, the surface of substrate 90 is symmetrically exposed to gases that allow uniform film formation on substrates.

In one embodiment, the gas delivery apparatus 130 comprises a processing chamber lid 170. The chamber lid 170 includes an expanding channel 134 extending from a central portion of the chamber lid 170 and a bottom surface 160 extending from the expanding channel 134 to a peripheral portion of the chamber lid 170. In one embodiment, the chamber lid 134 also includes fluid channels 101 for heating or cooling the chamber lid 134. The bottom surface 160 is sized and shaped to substantially cover the substrate 90 disposed on the substrate support 92. The expanding channel 134 has gas inlets 136A, 136B to provide gas flows from two similar pairs of valves 142A/152A, 142B/152B.

In one configuration, the valves 142A, 142B are coupled to separate precursor gas sources but are preferably coupled to the same purge gas source. For example, the valve 142A is coupled to a first precursor gas source 138 and the valve 142B is coupled to a second precursor gas source 139, and both valves 142A, 142B are coupled to a purge gas source 140. Each valve 142A, 142B includes a delivery line 143A, 143B having a valve seat assembly 144A, 144B and each valves 152A, 152B includes a purge line 145A, 145B having a valve seat assembly 146A, 146B. The delivery line 143A, 143B is in communication with the first and second precursor gas source 138, 139 and is in communication with the gas inlet 136A, 136B of the expanding channel 134. The valve seat assembly 144A, 144B of the delivery line 143A, 143B controls the flow of the precursor gas from the precursor gas source 138, 139 to the expanding channel 134. The purge line 145A, 145B is in communication with the purge gas source 140 and intersects the delivery lines 143A, 143B downstream of the valve seat assembly 144A, 144B of the valves 142A, 142B. The valve seat assembly 146A, 146B of the purge line 145A, 145B controls the flow of the purge gas from the purge gas source 140 to the delivery line 143A, 143B. If a carrier gas is used to deliver precursor gases from the precursor gas source 138, 139, preferably the same gas is used as a carrier gas and a purge gas (e.g., an argon gas used as a carrier gas and a purge gas). In one embodiment, the delivery lines 143A, 143B include an infrared based scanning electron microscope (SEM) to detect the species flowing therein.

Each valve seat assembly 144A, 144B, 146A, 146B may comprise a diaphragm and a valve seat (not shown). The diaphragm may be biased open or closed and may be actuated closed or open respectively. Programmable logic controllers 148A, 148B may be coupled to the valves 142A, 142B to control actuation of the diaphragms of the valve seat assemblies 144A, 144B, 146A, 146B of the valves 142A, 142B. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 142A, 142B may be a zero dead volume valve to enable flushing of a precursor gas from the delivery line 143A, 143B when the valve seat assembly 144A, 144B of the valve is closed. For example, the purge line 145A, 145B may be positioned adjacent the valve seat assembly 144A, 144B of the delivery line 143A, 143B. When the valve seat assembly 144A, 144B is closed, the purge line 145A, 145B may provide a purge gas to flush the delivery line 143A, 143B. In the embodiment shown, the purge line 145A, 145B is positioned slightly spaced from the valve seat assembly 144A, 144B of the delivery line 143A, 143B so that a purge gas is not directly delivered into the valve seat assembly 144A, 144B when open. A zero dead volume valve as used herein is defined as a valve which has negligible dead volume (i.e., about zero dead volume).

Each valve pair 142A/152A, 142B/152B may be adapted to provide a combined gas flow and/or separate gas flows of the precursor gas 138, 139 and the purge gas 140. In reference to the valve pair 142A/152A, one example of a combined gas flow of the precursor gas 138 and the purge gas 140 provided by valve 142A comprises a continuous flow of a purge gas from the purge gas source 140 through purge line 145A and pulses of a precursor gas from the first precursor gas source 138 through delivery line 143A. The continuous flow of the purge gas may be provided by leaving diaphragm of the valve seat assembly 146A of the purge line 145A open. The pulses of the precursor gas from the first precursor gas source 138 may be provided by opening and closing the diaphragm of the valve seat 144A of the delivery line 143A. In reference to valve pair 142A, 152A, one example of separate gas flows of the first precursor gas 138 and the purge gas 140 provided by valve 142A comprises pulses of a purge gas from the purge gas source 140 through purge line 145A and pulses of a precursor gas from the first precursor gas source 138 through the delivery line 143A. The pulses of the purge gas may be provided by opening and closing the diaphragm of the valve seat assembly 146A of the purge line 145A. The pulses of the precursor gas from the first gas source 138 may be provided by opening and closing the diaphragm valve seat 144A of the delivery line 143A.

The delivery lines 143A, 143B of the valves 142A, 142B may be coupled to the gas inlets 136A, 136B through gas conduits 150A, 150B. The gas conduits 150A, 150B may be integrated or may be separate from the valves 142A, 142B. In one aspect, the valves 142A, 142B are coupled in close proximity to the expanding channel 134 to reduce any unnecessary volume of the delivery line 143A, 143B and the gas conduits 150A, 150B between the valves 142A, 142B and the gas inlets 136A, 136B.

While only two precursor gas sources 138, 139 and their respective configurations are discussed, it is contemplated that any number of precursor gas sources may be provided in the gas delivery apparatus 130. For example, the valves 142A, 142B may be coupled to the any number of additional gas sources to deliver any number of precursor gasses.

The expanding channel 134 comprises a channel which has an inner diameter which increases from an upper portion 137 of a cap 172 to a lower portion 135 of the expanding channel 134 adjacent the bottom surface 160 of the processing chamber lid 170. The expanding channel 134 is configured to provide a total gas flow of between about 500 sccm and about 3,000 sccm.

In general, a larger gas flow will require a larger diameter expanding channel. In one embodiment, the expanding channel 134 may be shaped as a truncated cone (including shapes resembling a truncated cone). Whether a gas is provided toward the walls of the expanding channel 134 or directly downward towards the substrate, the velocity of the gas flow decreases as the gas flow travels through the expanding channel 134 due to the expansion of the gas. The reduction of the velocity of the gas flow helps reduce the likelihood the gas flow will blow off precursor absorbed on the surface of the substrate 90.

In one embodiment, the gas inlets 136A, 136B are located adjacent the upper portion 137 of the expanding channel 134. In other embodiments, one or more gas inlets may be located along the length of the expanding channel 134 between the upper portion 137 and the lower portion 135.

The above-described processing chamber 100 can be controlled by a processor based system controller such a controller 180. For example, the controller 180 may be configured to control flow of various precursor gases and purge gases from gas sources 138, 139, 140 through the valves 142A, 142B, 152A, 152B during different stages of a substrate process sequence. The controller 180 includes a programmable central processing unit (CPU) 182 that is operable with a memory 186 and a mass storage device, an input control unit, and a display unit (not shown), such as power supplies, clocks, cache, input/output (I/O) circuits, and the like, coupled to the various components of the processing chamber 100 to facilitate control of the deposition process. The controller 180 also includes hardware for monitoring substrate processing through sensors in the processing chamber 100, including the sensors 188 monitoring the precursor and purge gas flow. Other sensors that measure system parameters such as substrate temperature, chamber atmosphere pressure and the like, may also provide information to the controller 180.

To facilitate control of the processing chamber 100 and the gas delivery apparatus 130 as described above, the CPU 182 may be one of any form of general purpose computer processor that can be used in an industrial setting, such as a programmable logic controller (PLC), for controlling various chambers and sub-processors. The memory 186 is coupled to the CPU 182 and the memory 186 is non-transitory and may be one or more of readily available memory such as random access memory (RAM), read only memory (ROM), floppy disk drive, hard disk, or any other form of digital storage, local or remote. Support circuits 184 are coupled to the CPU 182 for supporting the processor in a conventional manner. The deposition process is generally stored in the memory 186, typically as a software routine 183. The software routine 183 may also be stored and/or executed by a second CPU (not shown) that is remotely located from the hardware being controlled by the CPU 182.

The memory 186 contains instructions that the CPU 182 executes to facilitate the operation of the processing chamber 100. The instructions in the memory 184 are in the form of program code such as a program that implements the method of the present disclosure. The program code may conform to any one of a number of different programming languages. In one embodiment, program code controls the delivery of the first precursor source 138 and the second precursor gas source 139, as well as the purge gas source 140.

In one embodiment, an N-Metal layer is deposited on the substrate 90 in the processing chamber 100. The term "N-Metal" refers to a metal having a work function of less than about 4.3 eV. For example, in one embodiment, the N-metal is a titanium aluminide (TiAl) film formed on the substrate 90. Details for depositing N-Metal films comprising aluminum alloys, such as TiAl, may be found in U.S. patent application Ser. No. 13/930,194, entitled "N-Metal Films Comprising Aluminum Alloys," Gandikota et al., filed on Jun. 28, 2013. In one embodiment, the TiAl is formed on the substrate 90 by flowing a metal precursor gas as the first precursor gas source 138, one or more aluminum precursor gasses as the second precursor gas source 139, and an alane compound or an alane-containing precursor gas, wherein alane refers to aluminum hydride or $AlH_3$. The alane compound or alane-containing precursor gas may be supplied to the substrate 90 via the configurations (i.e., delivery lines and valves) for the first or second precursor gas source 138, 139, or include its own configurations. The sidewalls 84 and lid 170 of the processing chamber 100 may be heated by the fluid channels 101.

Examples of metal precursors include, but are not limited to, metal halide precursors such as $TiCl_4$, $TaCl_5$ and $HfCl_4$.

Examples of aluminum precursors include, but are not limited to, alkyl aluminum precursors such as dimethylaluminum hydride (DMAH), diethylhydridoaluminum, methyldihydroaluminum, and alkyl aluminum hydrides of the following formula $[(C_xH_y)_{3-a}AlH_a]_n$, wherein x has a value of 1 to 3, y has a value of 2x+2, a has a value of 1 to 2, and n has a value of 1 to 4.

Examples of alane compounds and alane-containing precursors include, but are not limited to dimethylethylamine alane (DMEAA), methylpyrrolidine alane (MPA) and di(m-ethylpyrrolidine)alane. In one embodiment, a purge gas may be flowed between flowing of the above listed precursor gasses or simultaneously flowed with the precursor gasses. The resulting TiAl film may also be formed on various components in the processing chamber 100, such as the substrate support 92, chamber lid 170, liner, purge ring 122, or any processing chamber component exposed to the above precursor gasses.

Figure 2:
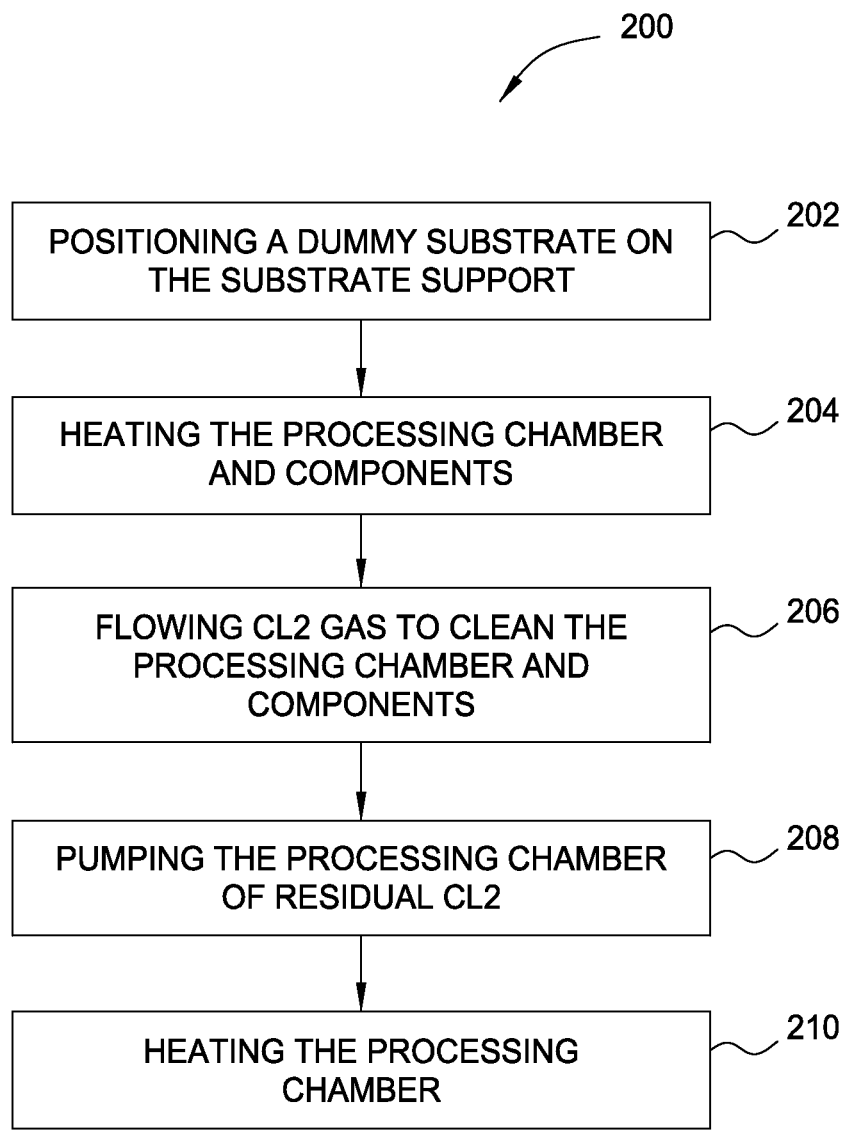
FIG. 2 illustrates a flow diagram for a method for cleaning a processing chamber according to one embodiment of the invention.

FIG. 2 illustrates a flow diagram for a method 200 for cleaning the processing chamber 100 according to one embodiment of the invention. Referring to FIGS. 1 and 2, after the TiAl film is formed on the substrate 90, a robot retrieves the processed substrate 90 via the slit valve 88 and places a dummy substrate on the substrate support 92 at block 202. At block 204, the processing chamber 100 and the processing chamber components are heated to at least about 50 degrees Celsius, for example, about 70 degrees Celsius to about 100 degrees Celsius, or for example, about 70 degrees Celsius or about 100 degrees Celsius. In one embodiment, at least one or both of the processing chamber sidewalls 84 and the chamber lid 170 are heated via the fluid channels 101, and the substrate support 92 is heated via the embedded heating element. In one embodiment, the sidewalls 84 are heated by energizing heat cartridges embedded in the sidewalls 84. It is contemplated that the processing chamber 100 and the processing chamber components may be heated in any suitable manner to generate a temperature of at least about 50 degrees Celsius, as discussed above.

At block 206, a cleaning gas, for example chlorine gas or $Cl_2$, is flowed over the dummy substrate. In one embodiment, the chlorine gas may be delivered to the dummy substrate via any of the precursor delivery lines 143A, 143B depending on if one or more of the delivery lines 143A, 143B also have TiAl film deposition and require cleaning. In one embodiment, the chlorine gas is delivered at least about 500 sccm, for example at about 1000 sccm. In another embodiment, an inert gas accompanies the cleaning gas. For example, argon gas is flown along with the chlorine gas at about 1000 sccm. In one embodiment, the pressure in the processing chamber 100 is adjusted from the pressure used during the N-metal film deposition process to a pressure used for the cleaning process 200. For example, the pressure of the processing chamber 100 during N-Metal deposition may be about 1.5 Torr to about 1.8 Torr, while the pressure may be increased during the cleaning process 200, for example to greater than about 5 Torr, such as about 10 Torr. The chamber pressure is reduced back to a pressure lower than 5 Torr suitable for N-Metal deposition on another substrate after the cleaning process 200 is complete. In one embodiment, the chlorine gas and argon gas are flown for at least about five minutes. In one embodiment, the infrared based SEM on the delivery lines 143A, 143B detects when the chlorine gas is done cleaning the TiAl film, and signaling the controller 180 stop the cleaning process 200.

The thermal chlorine gas cleaning process advantageously removes the TiAl film deposited on the processing chamber 100 and the processing chamber components without over-cleaning or over-etching the processing chamber components, and without the use of plasma. For example, in the embodiments discussed above, the TiAl film on the chamber components was reduced from about 85 Å thick to about 7 Å thick or about noise level. In one embodiment, the thermal chlorine gas clean results in about an 85% decrease in film reduction.

At block 208 the residual chlorine gas in the processing chamber 100 is evacuated via the vacuum system 178 and the pumping channel 179. At optional block 210 the processing chamber 100 is heated to temperatures suitable for subsequent N-metal deposition. In one embodiment, the processing chamber 100 pressure may also be reduced to a pressure suitable for subsequent N-metal deposition, e.g., about 1.5 Torr to about 1.8 Torr.

Therefore, by decreasing the amount of film on the processing chamber components the thermal chlorine gas cleaning processing beneficially: (i) prevents particulates from shedding and damaging the substrate 90; and (ii) extends the lifetime of the processing chamber components.

The invention claimed is:

1. A method for cleaning N-Metal film deposits in a processing chamber, the method comprising:
    positioning a dummy substrate on a substrate support in the processing chamber;
    heating the processing chamber to over at least 50 degrees Celsius and less than 500 degrees Celsius;
    flowing chlorine gas into the processing chamber to remove the N-metal film deposits from the processing chamber; and
    evacuating the chlorine gas from the processing chamber.

2. The method of claim 1, wherein heating the processing chamber comprises:
    flowing a fluid in a fluid channel of a lid and sidewalls of the processing chamber.

3. The method of claim 1, wherein heating the processing chamber comprises:
    energizing heater cartridges embedded in sidewalls of the processing chamber.

4. The method of claim 1, wherein flowing chlorine gas further comprises:
    flowing chlorine gas at a rate of at least 500 sccm into the processing chamber.

5. The method of claim 4 further comprising:
    flowing argon gas with the chlorine gas into the processing chamber.

6. The method of claim 1, wherein flowing chlorine gas further comprises:
    flowing chlorine gas at a rate of about 1000 sccm into the processing chamber.

7. The method of claim 1 further comprising:
    maintaining a chamber pressure greater than about 5 Torr while flowing the chlorine gas into the processing chamber.

8. The method of claim 1 further comprising:
    removing the dummy substrate from the processing chamber;
    positioning a substrate in the processing chamber after the dummy substrate has been removed; and
    depositing a layer of N-Metal on the substrate disposed in the processing chamber.

9. The method of claim 8, wherein depositing the layer of N-Metal on the substrate further comprises:
    maintaining the processing chamber at a pressure less than that utilized to remove the N-Metal film deposits.

10. The method of claim 1 further comprising:
    detecting the chlorine gas in a delivery line using an infrared based scanning electron microscope.

11. A method for cleaning N-Metal film deposits in a processing chamber, the method comprising:
    depositing a layer of N-Metal on a substrate disposed on a substrate support positioned in the processing chamber;
    removing the substrate from the processing chamber;
    positioning a dummy substrate on the substrate support; and
    performing a cleaning process while the dummy substrate is disposed in the processing chamber, the cleaning process comprising:
        heating the processing chamber to over at least 50 degrees Celsius and less than 500 degrees Celsius; and
        flowing chlorine gas into the processing chamber to remove the N-metal film deposits from the processing chamber.

12. The method of claim 11, wherein flowing chlorine gas further comprises:

flowing chlorine gas at a rate of at least 500 sccm into the processing chamber.

13. The method of claim 12 further comprising:
flowing argon gas with the chlorine gas into the processing chamber.

14. The method of claim 11 further comprising:
maintaining a chamber pressure greater than about 5 Torr while flowing the chlorine gas into the processing chamber.

15. The method of claim 11, wherein depositing the layer of N-Metal on the substrate further comprises:
maintaining the processing chamber at a pressure less than that utilized to remove the N-Metal film deposits from the processing chamber.

16. The method of claim 11 further comprising:
detecting the chlorine gas in a delivery line using an infrared based scanning electron microscope.

17. The method of claim 11 further comprising:
adjusting between deposition and cleaning, at least one or both of:
(a) a temperature of at least one of the sidewall and a lid of the processing chamber; and
(b) a pressure of gases disposed within the processing chamber.

18. A method for cleaning N-Metal film deposits in a processing chamber, the method comprising:
positioning a dummy substrate on a substrate support in the processing chamber;
heating the processing chamber to over at least 50 degrees Celsius, wherein heating the processing chamber comprises:
heating the processing chamber to between about 70 degrees Celsius to about 100 degrees Celsius;
flowing chlorine gas into the processing chamber to remove the N-metal film deposits from the processing chamber; and
evacuating the chlorine gas from the processing chamber.

19. A method for cleaning N-Metal film deposits in a processing chamber, the method comprising:
depositing a layer of N-Metal on a substrate disposed on a substrate support positioned in the processing chamber, wherein depositing the layer of N-Metal on the substrate comprises:
depositing a layer of titanium aluminide;
removing the substrate from the processing chamber;
positioning a dummy substrate on the substrate support; and
performing a cleaning process while the dummy substrate is disposed in the processing chamber, the cleaning process comprising:
heating the processing chamber to over at least 50 degrees Celsius; and
flowing chlorine gas into the processing chamber to remove the N-metal film deposits from the processing chamber.

20. A method for cleaning N-Metal film deposits in a processing chamber, the method comprising:
depositing a layer of N-Metal on a substrate disposed on a substrate support positioned in the processing chamber;
removing the substrate from the processing chamber;
positioning a dummy substrate on the substrate support; and
performing a cleaning process while the dummy substrate is disposed in the processing chamber, the cleaning process comprising:
heating the processing chamber to over at least 50 degrees Celsius, wherein heating the processing chamber comprises:
heating the processing chamber to between about 70 degrees Celsius to about 100 degrees Celsius; and
flowing chlorine gas into the processing chamber to remove the N-metal film deposits from the processing chamber.

* * * * *

UNITED STATES PATENT AND TRADEMARK OFFICE
CERTIFICATE OF CORRECTION

PATENT NO.        : 9,530,627 B2
APPLICATION NO.   : 14/484423
DATED             : December 27, 2016
INVENTOR(S)       : Srinivas Gandikota et al.

It is certified that error appears in the above-identified patent and that said Letters Patent is hereby corrected as shown below:

On the Title Page
Item (57), in Column 2, in "Abstract", Line 12, before "degrees" delete "about".
In the Specification
In Column 6, Lines 47-48, delete "dimethyaluminum" and insert -- dimethylaluminum --, therefor.
In Column 7, Line 51, delete "85 A" and insert -- 85 Å --, therefor.
In Column 7, Line 52, delete "7 A" and insert -- 7 Å --, therefor.
In the Claims
In Column 10, Lines 30-31, in Claim 20, delete "comprises;" and insert -- comprises: --, therefor.

Signed and Sealed this
Twenty-first Day of March, 2017

Michelle K. Lee
*Director of the United States Patent and Trademark Office*